United States Patent [19]

Tsou

[11] Patent Number: 5,007,982

[45] Date of Patent: Apr. 16, 1991

[54] REACTIVE ION ETCHING OF SILICON WITH HYDROGEN BROMIDE

[75] Inventor: Len-Yan Tsou, New City, N.Y.

[73] Assignee: North American Philips Corporation, New York, N.Y.

[21] Appl. No.: 217,536

[22] Filed: Jul. 11, 1988

[51] Int. Cl.⁵ .................... H01L 21/306; B44C 1/22
[52] U.S. Cl. ................................ 156/643; 156/646; 156/657; 156/659.1; 156/662
[58] Field of Search ............ 156/646, 643, 657, 659.1, 156/644, 662

[56] References Cited

U.S. PATENT DOCUMENTS

| | | | |
|---|---|---|---|
| 4,432,132 | 2/1984 | Kinsbron et al. | 156/643 X |
| 4,490,209 | 12/1984 | Hartman | 156/643 |
| 4,778,563 | 10/1988 | Stone | 156/646 X |
| 4,784,720 | 11/1988 | Douglas | 156/646 X |

Primary Examiner—David A. Simmons
Assistant Examiner—Thi Dang
Attorney, Agent, or Firm—Paul R. Miller

[57] ABSTRACT

A plasma etching process using HBr is set forth in which etching of silicon and polysilicon in IC manufacture is significantly improved by the high etching selectivity for either silicon and polysilicon to both oxides and photoresist materials.

13 Claims, 2 Drawing Sheets

REACTIVE ION ETCHING OF SILICON WITH HYDROGEN BROMIDE

The present invention is directed to a technique for obtaining highly selective plasma etching of silicon, and in particular, hydrogen bromide has been found to accomplish such highly selective etching.

The use of a plasma to etch polysilicon has a long history in semiconductor processes. As line width control becomes critical in obtaining small dimensions, chlorinated freon, such as $CFCl_3$, is employed in parallel plate etchers for anisotropic etching. Sidewall passivation by polymers formed in a freon plasma prevents lateral etching by atomic fluorine which spontaneously reacts with silicon. However, the carbon-containing species generated in freon discharges also etches oxides. In order to preserve thin gate oxides during overetching techniques, chlorine plasma is commonly employed to etch polysilicon with an etch rate selectivity of 20:1 for the etch rate of polysilicon to the etch rate of a gate oxide. But such etching erodes the photoresist and results in a narrower etched line.

Various efforts have been undertaken in the prior art to obtain a highly selective etch process for manufacturing devices, such as IC semiconductor components, where the size of such devices shrink and thinner gate oxides are utilized. In the case of a double polysilicon structure, where the second level of the polysilicon structure crosses a first polysilicon level having a 5,000 angstrom thickness, a 100% overetch is required to clear the stringer at the steep step. Therefore, selectivity of the etching process must be better than 30:1 in order to preserve a gate oxide thickness of 250 angstroms in a 1M DRAM, as well as in other advanced VLSI devices.

As a general rule in organic chemistry, the reactivity of halogen decreases in order from F, Cl, to Br. Furthermore, the extremely low reaction probability ($<10^{-5}$) of bromine atoms on silicon surfaces indicates that ion bombardment would play an important role in the plasma etching and no sidewall passivation is needed to achieve an anisotropic profile.

Anisotropic etching of silicon with a plasma having a Cl-containing compound, such as $BCl_3$ has been studied with $Br_2$ added to it. Such bromine additions in a chlorine containing compound may be seen in U.S. Pat. No. 4,450,042, but the highest etch rates were found to be achieved for the chemistry $He-BCl_3-Br_2$. It is emphasized that $Br_2$ cannot etch polysilicon unless it is mixed with a chlorine- or fluorine-containing compound.

In prior attempts of plasma etching, U.S. Pat. Nos. 4,490,209 and 4,502,915 have considered a two step plasma process for selective anisotropic etching in which an etchant combination of hydrogen chloride, hydrogen bromide, and helium was used. This compound achieves anisotropic etching as a Si-Cl-Br compound in silicon.

A further study was reported in the Journal of Vacuum Science Technology B Vol. 6, No. 1, January/February 1988, pages 257–262, in which single crystal and polycrystalline silicon was etched in a pure $Br_2$ plasma using a magnetically enhanced reactive ion etching arrangement. In this respect, two ferrite disc magnets were used to enhance discharge by providing a magnetic field to enhance the plasma. It was found that the etched surface was not clean when photoresist was employed. This reference emphasizes the use of pure bromine plasmas to achieve magnetically enhanced etching.

The presently claimed invention seeks to significantly improve reactive ion etching (RIE) of polysilicon using a hydrogen bromide (HBr) plasma for etching polysilicon. It has been found that a hydrogen bromide or HBr plasma significantly improves ion etching of polysilicon and silicon, especially where thin gate oxide layers are present on silicon, and where photoresist masks are used to selectively etch the polysilicon.

It has been found that both HBr and $Br_2$ are significantly better polysilicon or silicon etchants than, for example, $Cl_2$. On the other hand, it has been found that $Br_2$ attacks photoresist by an order of magnitude greater than HBr. That is, the selectivity of etching silicon to photoresist is of the order of 3:1 to 4:1 for $Br_2$, while for the etchant HBr of the present invention the etch rate ratio of polysilicon to photoresist is 60:1.

This high selectivity for HBr of the present invention applies both to the photoresist and oxide layers, such as the thin gate oxide used in manufacturing IC semiconductor devices. For example, the selectivity of etching of polysilicon to oxide is in the ratio of 100:1 for HBr. Prior art attempts of etching polysilicon by using $Cl_2$ only achieve a selectivity of etching of 30:1 relative to oxides. Accordingly, the presently claimed invention provides a significantly improved etching both relative to the oxide and to the photoresist.

Moreover, as compared to the prior art, hydrogen bromide is easier to handle than $Br_2$.

Accordingly, the presently claimed invention provides a significantly improved method of manufacturing semiconductors by selectively etching a layer of a silicon-bearing material using the steps of providing a patterned mask over the layer of silicon-bearing material to expose only areas to be etched, removing any surface oxides from the silicon-bearing layer with an oxide etching plasma, and then exposing the silicon-bearing layer to a hydrogen bromide plasma to selectively etch the silicon bearing layer relative to the mask and any and silicon oxide.

The silicon-bearing material may be, for example, silicon, polysilicon (both doped and undoped), tantalum silicide or titanium silicide.

Also, the hydrogen bromide plasma may include HBr gas or HBr gas mixed with an inert gas, such as, for example, He, Ar, or $N_2$. The oxide etching plasma may be, for example, one of freon, silicon tetrachloride, or boron trichloride. This oxide etching plasma initially removes any surface or native oxides that form on the silicon-bearing material. This vastly improves the etching of the silicon-bearing layer with a HBr plasma.

Another feature of the present invention is an improved method of manufacturing semiconductor IC components by etching where the steps of forming a composite structure of a silicon substrate with a thin covering layer of silicon oxide on the silicon substrate and a polysilicon layer on the oxide with a photoresist on parts of the polysilicon layer are carried out and further removing any surface oxides from the polysilicon layer with an oxygen-etching plasma, and then exposing the composite structure to a hydrogen bromide plasma to selectively etch the polysilicon layer relative to the photoresist and the silicon oxide.

This technique will produce semiconductor elements for use in ICs having extremely narrow polysilicon lines. In addition, trenches can be produced in silicon with a photoresist mask; and 10μm deep trenches can be successfully achieved.

BRIEF DESCRIPTION OF THE DRAWINGS

Embodiments of the invention will now be described, by way of example, with reference to the accompanying drawings, in which.

DETAILED DESCRIPTION OF THE DRAWINGS

Figure 1:
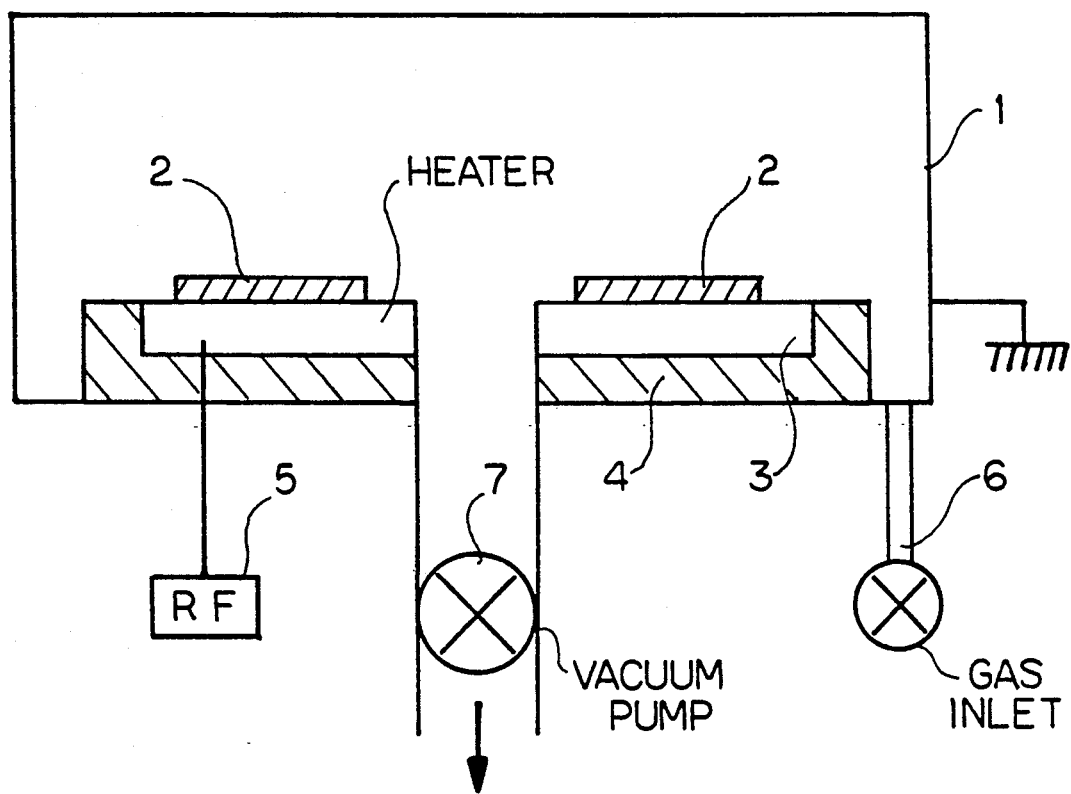
FIG. 1 illustrates a reactive ion etcher for carrying out the present invention.

In FIG. 1 a reactive ion etcher is shown including a reactor chamber 1. A semiconductor wafer 2 is provided in this chamber being mounted on a water cooled electrode 3 which is powered with a RF power source 5, for example. The electrode 3 and wafer 2 rest on an insulator structure 4. Gas is delivered into the chamber through the entrance 6. Vacuum is maintained by the pump 7. An example of this structure may be a Plasma-Therm reactive ion etcher, such as model PK-2480, equipped with a turbo molecular pump. Hydrogen bromide gas is provided with a nominal gas flow, for example, of 20 sccm under a pressure of 20 millitorr.

Figure 2A:
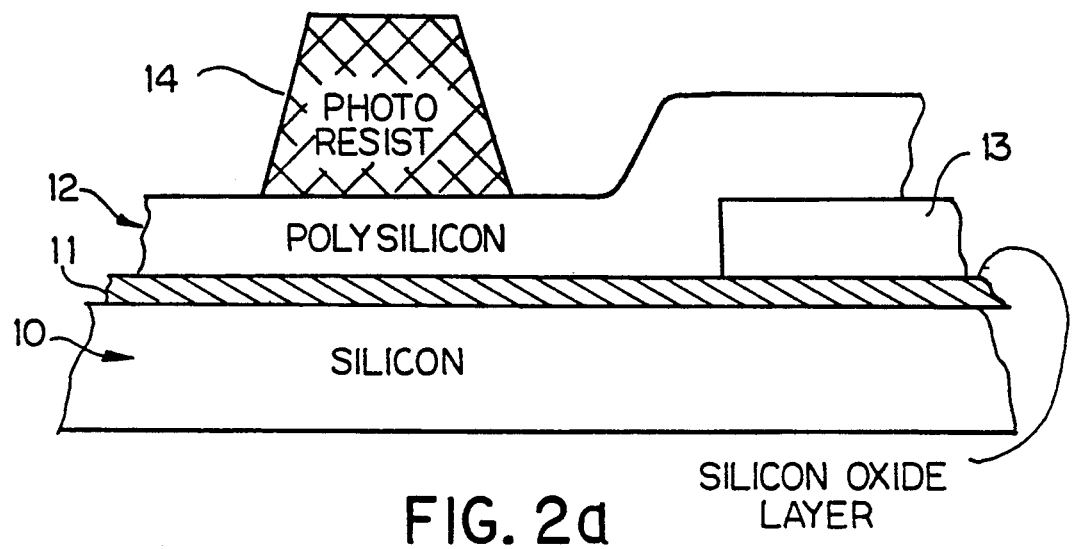
FIG. 2A shows in partial cross-section semiconductor components before etching.

The semiconductor wafers may be of 100 millimeter diameter having a 5,000 angstrom thick layer of polysilicon 12 on a 500 angstrom thick gate silicon oxide 11, as shown in FIG. 2A. These layers are provided on a silicon substrate 10. A layer 13, also of 5,000 angstrom thickness, is also shown which has been previously provided on the silicon dioxide layer 11. This layer 13 may be a previously etched polysilicon layer, i.e., similar to that to be formed from layer 12, or other materials and/or dopings for a semiconductor device. In order to form various patterns of the polysilicon layer 12, photoresist patterns, such as pattern 14 is provided on the polysilicon layer 12. The photoresist may be, for example, a patterned Shipley AZ-1470 postbaked to 120° C. The photoresistor coverages of these patterns may vary, for example only, from 10%, 40%, and 60% of the semiconductor area. Such photoresist coverages can provide various different IC masks.

Prior to etching this structure, the wafer is initially exposed to an oxide etching plasma, such as freon, for about 1 minute to clear any native oxides on the surface of the polysilicon. Such native oxides can be formed naturally on silicon or polysilicon surfaces just by the presence, for example, of oxygen in the surrounding atmosphere. It has been found that clearing of such oxides from the surface of the silicon or polysilicon layers significantly enhances the ability for HBr etching of silicon and polysilicon.

Figure 2B:
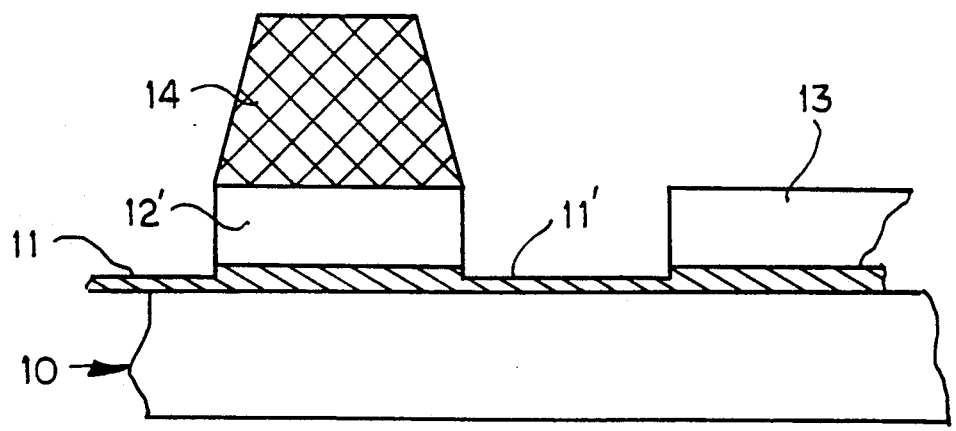
FIG. 2B shows the semiconductor components of FIG. 2A after etching.

FIG. 2B shows the semiconductor wafer after etching with a HBr plasma. In this etching, the polysilicon layer 12 is etched completely except under the photoresist 14 where polysilicon 12' remains. The photoresist 14 has been minimally or negligibly etched by the HBr plasma. Also, the silicon oxide gate layer 11, such as $SiO_2$, has been slightly etched in the area 11' following removal of overlying layers of the polysilicon 12.

While a difference is shown between the thickness of the layer 11 of silicon oxide and the layer 11', this difference is quite small and minimal in view of the fact that any etching of the oxide is significantly smaller than that of the polysilicon. The invention effectively provides a high selectivity of etching between the etch rate of the polysilicon to the etch rate of the oxide in amounts of 100:1. This value is significantly more than can be produced with prior etching with $Cl_2$.

A high selectivity of etching between the polysilicon and the photoresist also occurs in that a selectivity ratio of 60:1 between the etch rate of the polysilicon and the etch rate of the photoresist is achieved according to the present invention. On the other hand, prior art etching of the photoresist with $Cl_2$ produces etching of the photoresist with a selectivity of only 3:1, for example. The significant difference between the selectivity of etching of the photoresist and the polysilicon according to the present invention from that of the prior art enables extremely fine etching to be carried out in construction of IC devices.

It has been found that the etching with HBr is effective with polysilicon layers, as well as monocrystalline silicon layers. Moreover, the polysilicon may be doped such as with phosphorus, for example. The HBr plasma thus anisotropically etches polysilicon or single crystal silicon with extremely high selectivity to silicon dioxides and photoresist. Examples of photoresists may be Shipley AZ-1470 or Kodak -809 photoresist. The plasma etching process thus meets all basic requirements for pattern transfer, such as anisotropic profile, good photoresist integrity, high selectivity to underlayer, and freedom of polymers.

The hydrogen bromide plasma may include HBr gas mixed with an inert gas, such as He, Ar, or $N_2$.

The hydrogen bromide plasma is a much more suitable polysilicon etchant because of (a) the lateral etch rate is very low in the HBr plasma since the reaction probability of Si with atomic Br and thermal energies is a factor of 10 lower than that with Cl, for example, (b) plasma-enhanced polysilicon etch rates in HBr plasmas is compatible with that in chlorinated plasmas since the reaction rate is greater enhanced by Br ion bombardment ($>10^4$) at 100 eV, compared to that by Cl ion ($<10^4$), (c) the intrinsic oxide etch rate in the HBr plasma is at least a factor of 2 lower than that in chlorinated plasmas, and (d) photoresist etch rates in HBr plasmas is a factor of 10 lower than that in chlorinated plasmas.

What is claimed:

1. In a method of manufacturing semiconductor IC devices by etching comprising the steps of
   (a) forming a composite structure by
      (i) providing a silicon substrate,
      (ii) forming a thin layer of silicon oxide on said silicon substrate,
      (iii) forming a polysilicon layer on said oxide,
      (iv) forming a mask of a photoresist on at least parts of said polysilicon layer,
   (b) removing any surface oxides from said polysilicon layer with an oxide etching plasma, and
   (c) then exposing the composite structure to a plasma containing only hydrogen bromide to selectively etch said polysilicon layer relative to said photoresist and said silicon oxide.

2. A method according to claim 1, further comprising after said steps (b) and (c) the steps of removing said photoresist from said composite structure, forming at least a second polysilicon layer on said composite structure, forming at least a second photoresist on at least parts of said second polysilicon layer, removing any surface oxides from said second polysilicon layer with said oxide etching plasma, and then exposing said second polysilicon layer to said hydrogen bromide plasma, wherein said second polysilicon layer is selectively etched relative to said second photoresist.

3. A method according to claim 2, wherein said oxide etching plasma is selected from the group consisting of freon, silicon tetrachloride and boron trichloride.

4. A method according to claim 2, wherein said polysilicon layer is doped or undoped.

5. A method according to claim 1, wherein said hydrogen bromide selectively etches said polysilicon layer relative to said mask at an etch rate ratio of at least 60:1.

6. A method according to claim 5, wherein said polysilicon layer is selectively etched relative to said silicon oxide at a rate of 100:1.

7. A method according to claim 1, wherein said oxide etching plasma is selected from the group consisting of freon, silicon tetrachloride and boron trichloride.

8. A method according to claim 1, wherein said polysilicon layer is doped or undoped.

9. A method according to claim 1, wherein said polysilicon layer is selectively etched relative to said silicon oxide at a ratio of 100:1.

10. A method of manufacturing semiconductors by selectively etching a layer of a silicon-bearing material relative to a mask, comprising the steps of:
provinding a patterned mask of a photoresist over a layer of silicon-bearing material to expose only areas to be etched,
removing any surface oxides from said silicon-bearing layer with an oxide etching plasma, and
then exposing said silicon-bearing layer to a plasma containing only hydrogen bromide to selectively etch said silicon-bearing layer relative to said mask.

11. A method according to claim 10, wherein said silicon-bearing material is selected from the group consisting of silicon, doped or undoped polysilicon, tantalum silicide, and titanium silicide.

12. A method according to claim 10, wherein said oxide etching plasma is selected from the group consisting of freon, silicon tetrachloride, and boron trichloride.

13. A method according to claim 10, wherein said hydrogen bromide selectively etches said silicon-bearing layer relative to said mask at an etch rate ratio of at least 60:1.

* * * * *

UNITED STATES PATENT AND TRADEMARK OFFICE
CERTIFICATE OF CORRECTION

PATENT NO. : 5,007,982

DATED : April 16, 1991

INVENTOR(S) : Len-Yuan Tsou

It is certified that error appears in the above-identified patent and that said Letters Patent is hereby corrected as shown below:

Section 75, change "Len-Yan" to --Len-Yuan--.

Signed and Sealed this

Twelfth Day of May, 1992

Attest:

DOUGLAS B. COMER

*Attesting Officer*   Acting Commissioner of Patents and Trademarks